United States Patent [19]

Burden et al.

[11] 4,047,143
[45] Sept. 6, 1977

[54] FUSED RESISTIVE ELECTRICAL PROTECTION DEVICE

[75] Inventors: David M. Burden, Columbus; Frank N. Malaney, Pataskala, both of Ohio

[73] Assignee: Western Electric Company, Inc., New York, N.Y.

[21] Appl. No.: 703,875

[22] Filed: July 9, 1976

[51] Int. Cl.² .......................................... H01H 85/36
[52] U.S. Cl. .................................. 337/239; 337/252; 338/322
[58] Field of Search ............... 337/238, 239, 251, 252, 337/190, 261, 407, 408, 409; 338/232, 233, 322

[56] References Cited

U.S. PATENT DOCUMENTS

| | | | |
|---|---|---|---|
| 1,387,000 | 8/1921 | Fisher | 337/252 |
| 2,111,745 | 3/1938 | Boothe | 337/251 X |
| 2,485,221 | 10/1949 | Turnham et al. | 337/239 X |
| 2,966,649 | 12/1960 | Hayman | 337/183 X |
| 2,973,418 | 2/1961 | Whitman | 338/322 X |

Primary Examiner—George Harris
Attorney, Agent, or Firm—K. R. Bergum; R. P. Miller

[57] ABSTRACT

Several embodiments of a circuit protective device are disclosed that rely on a unique, spring-biased housing that cooperates with a leaded fusible element to effect a reliable open-circuit condition in response to a predetermined overload condition. The leads not only provide the means for interconnecting the device with associated circuitry, but are specially configured to provide a simplified, inexpensive and reliable way of holding the assembled device together, in opposition to a predetermined closed-circuit tensional biasing force applied thereagainst by the housing, during normal operation. The leads may also advantageously be configured during the assembly of the device to provide the means for directly mounting the device on, and optionally (with pre-formed stops) in spaced relationship with, a circuit board.

In several preferred embodiments, the fusible element comprises a leaded resistor of a type that is capable of fracturing when subjected to a predetermined overload condition and, thereby, producing a reliable open-circuit condition when separated into two sections by the force imparted thereagainst by the spring-biased housing.

16 Claims, 13 Drawing Figures

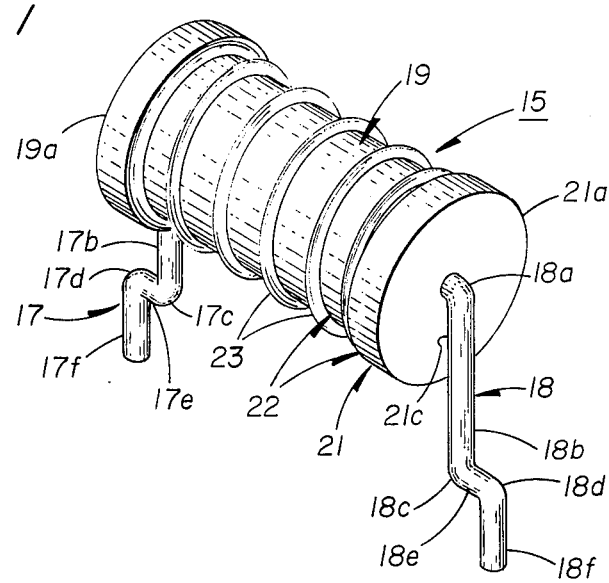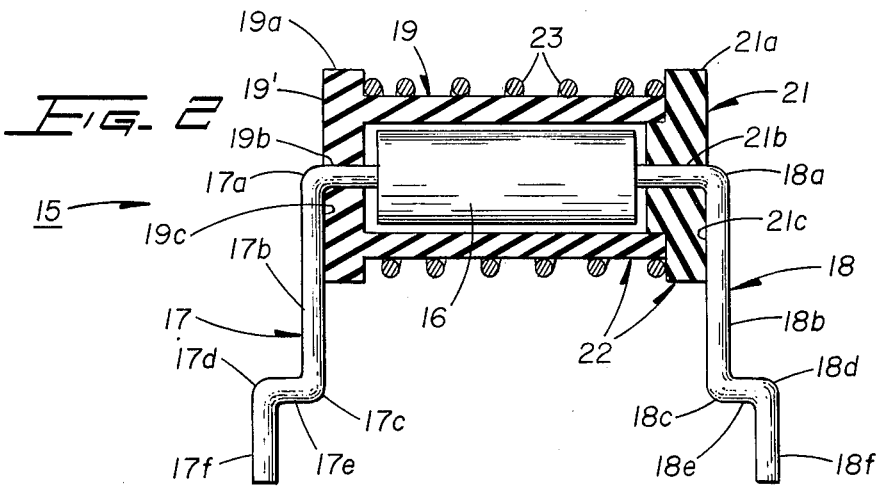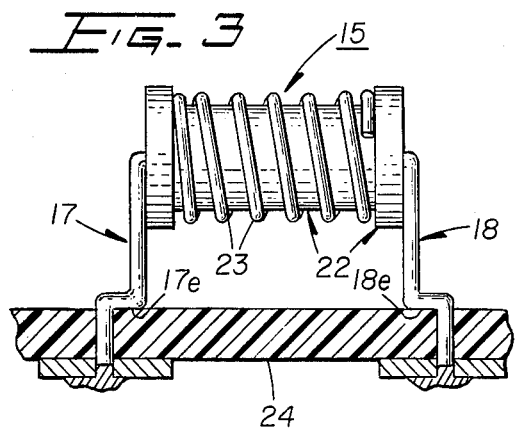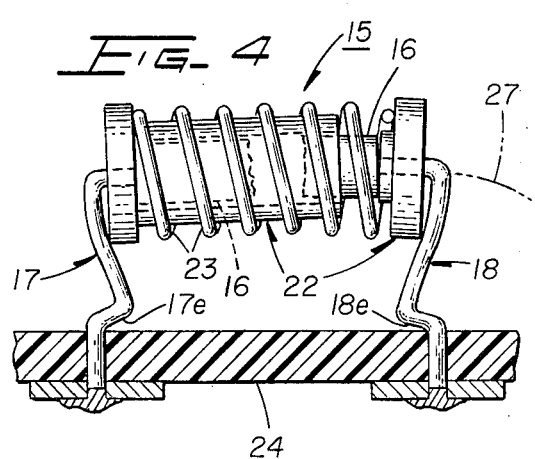

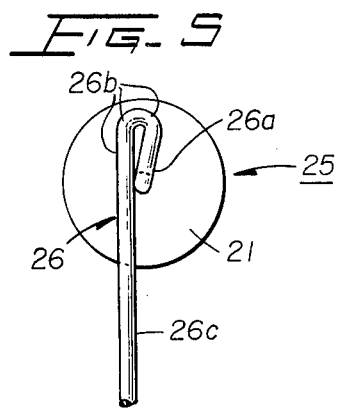
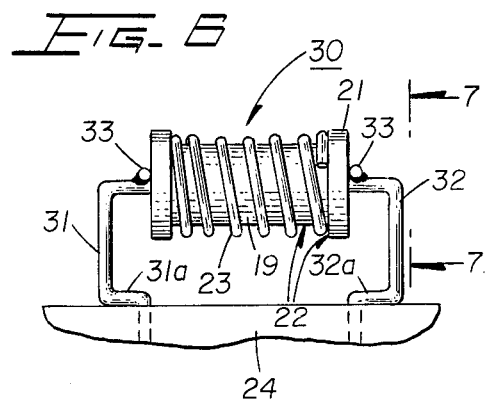
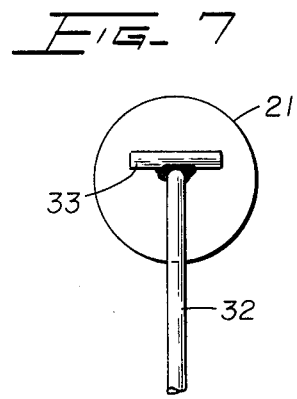
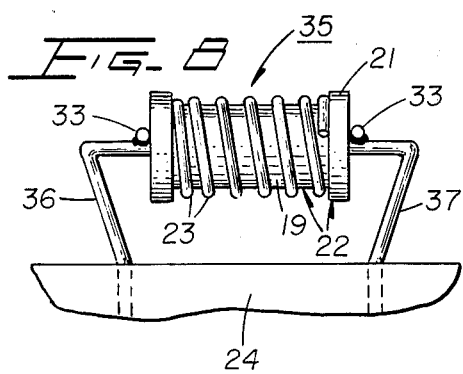
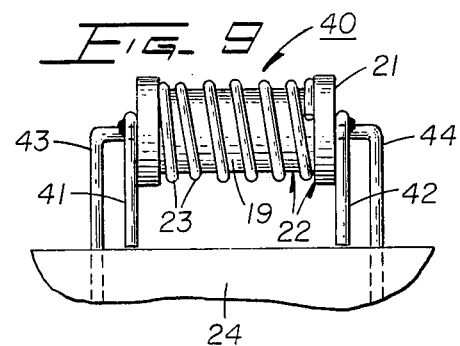
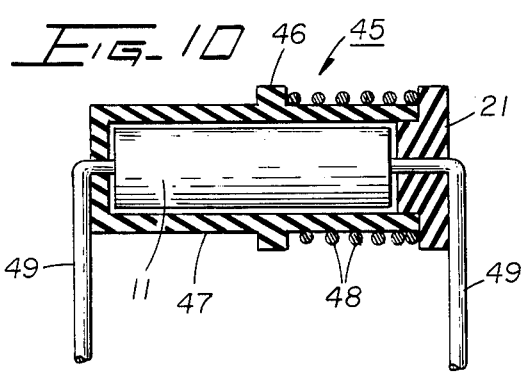
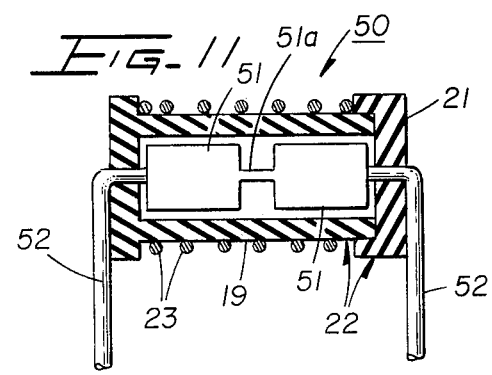
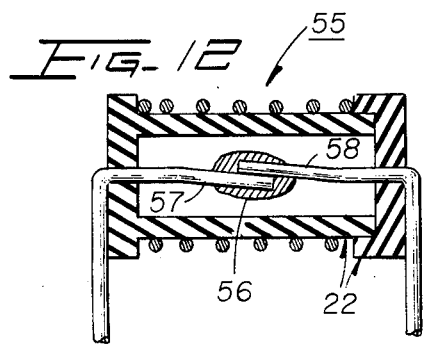
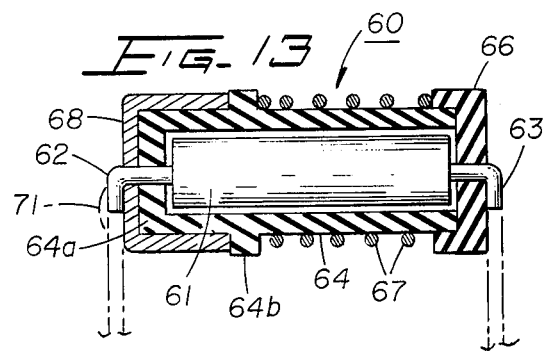

FUSED RESISTIVE ELECTRICAL PROTECTION DEVICE

BACKGROUND OF THE INVENTION

1. Field of the Invention

This invention relates to circuit protective devices and, more particularly, to fuse-type resistive devices applicable for direct mounting on printed circuit boards.

2. Description of the Prior Art

One common fuse-type protective device frequently employed heretofore incorporates a simple fusible wire element that is typically maintained under spring tension within an insulative housing, and which element melts or softens sufficiently when subjected to a predetermined current-induced overload condition so as to break and establish an open-circuit condition. One of the earliest and simplest of this type of fuse is the so-called fust plug, one of which is disclosed in R. S. Porter U.S. Pat. No. 1,340,080.j Such plugs typically have a tapered threaded end that is simply screwed into a socket-receiving electrical receptacle. A variation of that type of fuse, having fixedly secured metal end caps, and adapted for spring clip mounting, is disclosed in C. L. McAlister U.S. Pat. No. 2,913,555. Neither of the above-described prior art devices, of course, is adapted to employ leads not only to provide the means for interconnecting the device with associated circuitry, but to normally facilitate holding the assembled device together, and to provide the means for directly mounting the device on, and optionally (with pre-formed stops) in spaced relationship with, a circuit board, for example.

Neither of the above-mentioned types of circuit protective devices likewise incorporates a resistive element as part of the internal circuit path thereof. One prior protective device that does incorporate a resistor is disclosed in A. Haynman U.S. Pat. NO. 2,966,649. The resistor in that device is not enclosed within an insulative housing, nor does it function as a fusible element. Rather, an open-circuit condition is dependent on the melting of an external solder joint that connects a folded-back end portion of one of the resistor leads with a terminal that forms part of a bracket coaxially mounted on the resistor. The leads also have no preformed bends that would or could facilitate the direct mounting of the device on a circuit board, or that could function as inherent stops so as to position the resistor itself above the circuit board with a predetermined space therebetween. Such spacing is often desired in order to protect associated circuitry from any detrimental heat that could possibly develop should the protective device malfunction for any reason.

In still another prior resistive protection device particularly employed in the telephone industry, the resistor is mounted within an insulative housing, with one internal lead thereof being permanently secured to one conductive housing end cap, with the other lead being solder-connected to an internal elongated member that is normally maintained under spring-biased tension while secured to an opposite end stationary, conductive, housing end cap. An open-circuit condition in this latter device is also dependent on the melting of the internal soldered connection of predetermined dimensions. As this latter device has fixedly secured conductive end caps, it is not adapted for direct mounting, such as by the resistor leads, within suitably aligned thru-holes of a circuit board. There likewise is no means to space the housing of the device a predetermined distance above a circuit board as a safety factor.

From the foregoing, it is seen that neither of the described resistive type fuse-protective devices effect an open-circuit condition, in response to a given current-induced overload condition, without the need of a soldered connection as the fusible element. Moreover, the leads thereof are configured and secured in such a manner that they are neither readily adapted for direct circuit board securement, nor are they adapted for used as mounting elemnts with stops for spacing the body of the device above a circuit board.

With respect to resistive type protection devices, in particular, it would also be desirous to enclose the latter within an insulative housing in a manner that not only protects associated circuitry from possible heat damage, but provides a means for readily assembling and disassembling the device without the need of any soldered connections, fastening screws or threaded members. There is also a definite need for a resistive element that not only functions as the fusible element per se, but that is capable of withstanding momentary d-c and a-c voltage surges of relatively high magnitude, such as of the order of hundreds of volts, for time durations ranging from a fraction of a second to one or several seconds, without impairment, while still being very sensitive to very low steady state currents, such as on the order of milliamperes in magnitude.

Summary of the Invention

It, therefore, is an object of the present invention to provide a circuit protective device of simplified, rugged and inexpensive construction, and that may be readily assembled or disassembled without the need of soldered securements, separate fastening elements or threaded members, and which does not rely on a fusible element, independent of a resistive element, when employed, to effect an open-circuit condition.

It is a more specific object of the invention to provide a circuit protective device incorporating a leaded resistor type of fusible element that is capable of either fracturing, or at least establishing a sufficiently weakened condition along its axial length, when subjected to a predetermined steady state current-induced overload condition, so as to facilitate the physical separation thereof into two sections by biasing means to, thereby, effect a reliable open-circuit condition, and which leads facilitate the mounting of the device on, and the spacing of the main body portion thereof from, a supporting substrate, while simultaneously providing the means for device-circuit interconnection, and functioning to normally hold the composite assembled device together.

In accordance with the principles of the present invention, the above and other objects are realized in one preferred embodiment of a resistive protection device wherein a resistive element, preferably of the carbon resistor type, having axially disposed leads, and being capable of current-induced, physical open-circuit fracture along its axial length, is mounted within an insulative tubular member having lead-receiving apertured and flanged end walls, one of which is movable. A coil spring co-axially mounted on the tubular member is normally maintained under compression between the mutually disposed flanges, with the composite device normally held together by the leads being formed with sharp angular bends that engage the respectively adjacent outer surfaces of the flanged end walls. Such bends also provide parallel extending, terminating legs that facilitate the direct circuit board mounting of the device. Additional offset bends formed along intermediate regions of the leads facilitate the separation of the flange-engaging ends thereof, in response to an overload-induced fracture of the resistor, and further optionally provide stops for spacing the main body of the device above a circuit board.

As constructed, the preferred illustrative protection device is not only of simplified, rugged and inexpensive construction, but is readily assembled on a mass production basis. It is also quickly disassembled when required to replace a fractured fusible resistor, for example.

In addition, the fusible resistor, when of one particular carbon type, has been found to be very effective, and consistently reliable, in providing electrical equipment protection against any significant change of even very low magnitude steady state currents (or voltages), relative to the duration of such change, by fracturing in response to a predetermined overload to effect an open-circuit condition. Conversely, the internal resistance of such a resistor (i.e., without fracture) is relied on to protect associated equipment from diverse, momentary, high voltages, such as lightening surges.

As a result of such unique and beneficial operating characteristics, the present resistive protection device is particularly adapted, for example, for use in providing reliable interface protection between the telephone network, for example, and customer terminal station apparatus.

Other modified embodiments of the invention, utilizing both resistive and non-resistive fusible elements, are also disclosed, with all of them incorporating a uniquely spring-biased housing that cooperates with a pair of specially configured and multi-functioning fusible element leads.

BRIEF DESCRIPTION OF THE DRAWINGS

FIG. 1 is a perspective view of one preferred illustrative embodiment of a resistive protection device in accordance with the principles of the present invention;

FIG. 2 is a cross-sectional view of the device of FIG. 1;

FIG. 3 is a fragmentary side elevational view, partially in section, of the device of FIGS. 1 and 2, while in its normally closed-circuit state, as mounted on a printed circuit board in accordance with the principles of the present invention;

FIG. 4 is a fragmentary side elevational view, partially in section, similar to that of FIG. 3, but with the resistive element of the device being shown in phantom after having been fractured along its axial length and, thereafter, separated into two sections in response to the force imparted thereagainst by a biasing spring so as to effect a reliable open-circuit condition;

FIG. 5 is an end view of a device similar to the one depicted in FIGS. 1-4, but distinguishing therefrom in the manner in which external portions of the leads are configured so as to provide greater lead-end wall surface contact;

FIG. 6 is a side elevational view of a resistive protection device similar to the one depicted in FIG. 1, but distinguishing therefrom by incorporating leads of different external configuration, and by also incorporating an auxiliary wire segment secured to each lead immediately adjacent the outer surface of the associated flanged end wall of the device housing so as to facilitate the holding of the composite device together;

FIG. 7 is an end view of the device of FIG. 6, and illustrates more specifically the wire segment permanently secured to the lead;

FIG. 8 is a side elevational view of an alternative device similar to FIG. 6, but distinguishing therefrom by the configuration of the external portions of the leads;

FIG. 9 is a side elevational view of still another embodiment of the invention wherein an auxiliary wire segment is suitably secured to each lead, immediately adjacent the outer surface of the associated housing end wall, so as to facilitate the holding of the composite device together, with each wire segment being oriented and dimensioned in length so as to also function as a stop for spacing the main body of the device a predetermined distance above the adjacent surface of a printed circuit board;

FIG. 10 is another alternative embodiment of the invention that is similar to the device depicted in FIG. 1, but distinguishing therefrom by having a coil spring of shorter axial length that is coaxially mounted on the tubular housing, and confined between the movable flanged end wall and an integral boss located at an intermediate region along the tubular housing;

FIG. 11 is a further alternative embodiment of a fusible protection device wherein the fusible element is of the non-resitive type, and includes a necked-down intermediate portion that becomes appreciably weakened, and separated into two sections by the coil spring, whenever the device is subjected to a given overload condition;

FIG. 12 is an additional alternative embodiment similar to that of FIG. 11, but distinguishing therefrom by having external leads that extend axially inwardly within the housing to an intermediate region whereat they overlap, preferably with a predetermined interface, and being secured together at such an interface by a fusible material that is susceptible to melting when subjected to a given overload condition, and FIG. 13 is still another embodiment of a resistive protection device wherein the end of the tubular housing opposite the movable flanged end wall has a metallic end cap secured thereto that is adapted to allow the devcie to be mounted at that end in, and electrically connected to, a suitable spring clip.

DETAILED DESCRIPTION OF THE INVENTION

It should be appreciated that the fusible protective devices as embodied herein, and as described in greater detail hereinbelow, have universal application in protecting diverse types of electrical equipment. However, for purposes of specific illstration, a preferred embodiment of the subject invention is disclosed and described in connection with one particular application, namely, in functioning as a protective interface device for protecting telephone customer equipment.

With particular reference first to FIGS. 1 and 2, there is depicted a resistive protection device 15 comprised of an elongated resistive element 16, preferably of the carbon type, and having axially disposed leads 17, 18, mounted within an insulative tubular member 19. One end of the member 19 is closed by an integral end wall 19' that merges into a flanged portion 19a, whereas the oposite end of the member is normally closed by a movable insulative end wall 21 that is also formed with a flanged portion 21a. The tubular member 19 and movable end wall 21 together thus form a composite housing 22 for the resistor 16. Both the integral and movable housing end walls are formed with central apertures 19b and 21b, respectively, that allow passage of the associated resistor leads therethrough. A coil spring 23 is coaxially positioned on and extends along the axial length of the tubular member 19, and is normally maintained under a predetermined degree of compression between the flange portions, as will be described in greater detail hereinafter. By way of example, a coil spring made of 23 gauge steel wire, wound with about 8 turns per inch, and having an outside diameter of 0.300 inch, and cut to an axial length of 1.0 inch, has been found to be very effective for the purpose described herein.

The tubular member 19, and movable end wall 21, may be made out of any suitable insulative material that is capable of withstanding relatively high temperatures, such as on the order of 150° C, and exhibits good dielectric and carbon-tracking characteristics. One particular type of relatively low cost plastic material that has been found to exhibit excellent arc quenching and fire resistant properties is melamine phenolic. This material may be purchased, for example, under the registered tradename Plenco 755, from the Plastics Engineering Co.

In accordance with as aspect of the invention, the composite device 15 is held together, with the spring 23 under a predetermined degree of compression, by forming sharp, right angle bends 17a, 18a in the leads immediately adjacent the outer surfaces 19c, 21c of the respectively associated integral and movable housing end walls. As such, external lead segments 17b, 18b remain in firm engagement with the respectively adjacent end walls, and normally hold the composite assembled device 15 together without the need of any soldered or welded connections, or auxiliary fastening elements. Such right angle bends also facilitate the orienttation of the leads for direct insertion into respectively aligned thru-holes of a circuit board 24, depicted in only fragmentary form in FIGS. 3 and 4. The assembly of the composite device, including the bending of the leads into not only the configuration described above, but into additional configurations described in greater detail hereinafter, is most readily accomplished with the use of a suitable nesting fixture of jig, not shown.

In connection with circuit board mounting of the device 15, it is also preferable to form an intermediate pair of offset bends 17c, d, 18c,d, along an intermediate section of each lead. Such bends, when properly located, advantageously provide lead segment-defining stops 17e, 18e for spacing the composite housing 22 of the device a predetermined distance above the adjacent surface of the circuit board. This is often desired for reasons of safety should the device for some reason malfunction and not open in response to a given maximum current-induced overload condition. Should that ever occur, excessive heat could be generated in the resistor which would be transmitted by conduction to the composite housing 22, and to any adjacent associated circuitry mounted on the circuit board.

The intermediate offset bends, depending on their location and dimensions, also provide a wide range of possible spacings between the terminating, parallel extending leg portions 17f, 18f. As such, the lead ends may be readily configured for insertion into respectively aligned thru-holes of diverse types and codes of circuit boards, as well as other types of supporting substrates, as illustrated in FIG. 3.

The intermediate offset bends in the leads 17, 18 additionally serve another beneficial function, namely, to facilitate the increased spring-initiated spacing between the upper end wall-engaging ends thereof in response to an overload-induced fracture of the resistor 16. Such an open-circuit condition is depicted in FIG. 4, whereat it is seen that the spring 23 has expanded axially until it has acquired an essentially unbiased state. The horizontal stop-defining lead segments 17e, 18e (between the offset bends) are seen to advantageously allos the movable end wall 21 to separate more readily from the normally adjacent end of the tubular member 19, i.e., along a substantially larger arc, as indicated by the dashed line 27 in FIG. 4, than would otherwise be the case with leads that simply extended in straight-line fashion from the respectively engaging end walls to the receiving thru-holes of the circuit board 24.

With particular reference now to the resistive fusible element 16 per se, when it is suitable constructed and of the carbon type, it has the capability of fracturing along its axial length, in response to a predetermined current (or voltage) induced overload condition, so as to facilitate the establishment of a reliable open-circuit separation at the point of fracture. The maximum overload condition for any given resistor of the type in question is dependent, of course, on not only the magnitude of the current (and/or voltage), but on the steady-state duration thereof, with ambient termperature having a secondary minor effect.

One particular carbon resistor found very advantageous for the particular application described herein is sold by the Allen Bradley Co., and is identified by the Code No. EG. This particular resistor not only exhibits the characteristics of fracturing when subjected to a predetermined steady state overload condition, but is capable of withstanding substantially high momentary voltage surges, such as produced by lightening, without fracturing. In the latter case, the series resistance of the resistor is normally adequate to provide satisfactory interface protection between the telephone line and the station apparatus, for example.

By way of illustration, one particular 10 ohm carbon resistor, having a ½ watt rating, has been found to be capable of withstanding momentary voltage surges as high as 500 volts, which would typically include most lightning strikes. The resistor is also capable, however, of withstanding 400–500 volt d-c pulses ranging in duration from several microseconds to about one millisecond without fracturing.

Such high vlatage d-c pulses are often applied to communications lines when a problem of intermittent failure occurs therealong. A short d-c pulse of the type in question, referred to as a "cable burner", is employed either to fuse an intermittent open condition, or establish a permanent short or open condition at the point of the fault for easier subsequent location identification. While it, of course, is standard practice to disconnect both the central office equipment and the customer's station apparatus from any given line on which a "cable burner" pulse is to be applied, an inadvertent failure to do so can seriously impair the apparatus on either end of such a line without a suitable resistive interface protective device of the types embodied herein.

Potentially hazardous voltages may also be encountered, albeit hopefully infrequently, as a result of faulty wiring. Such foreign voltages may subject a fuse-type resistive element to either relatively high d-c voltages, or to a-c power voltages, the latter typically of either about 120 to 240 volts in magnitude. Advantageously, the type of resistor embodied in the subject protection device, as previously mentioned, will not only withstand momentary d-c voltages as high as 400 to 500 volts, but a-c voltages as high as 240 volts in magnitude for periods of one to several seconds.

Conversely, with respect to steady state conditions, a resistor of the type embodied herein, when exhibiting a series resistance of 10 ohms and a power rating of ½ watt, by way of example, is capable of fracturing when subjected to a steady state d-c current as low as 0.4 amperes, when applied for a period of 4 minutes. However, the same resistor will fracture when subjected to 1 ampere for about 3.4 seconds, or when subjected to 6 amperes for about 40 milliseconds. In these examples, the applied voltage was adjusted to maintain the particular current desired for testing, and the resistor was initially subjected to a life test at 150° F in an oven, with a current load of 0.200 amperes, for a period of 1008 hours.

From the foregoing, it is seen that a carbon resistor of the type in question may be constructed and dimensioned so as to fracture consistently over a relatively wide range of steady state current levels, when correlated with voltage and the time duration thereof, as well as ambient temperature, while similtaneously withstanding diverse types of momentary high voltage surges.

FIG. 5 illustrates an end view of a protective device 25 that is identical to device 15, with the exception that the leads thereof, such as lead 26, immediately after passing through the central aperture of the movable end wall 21, for example, is bent first at a right-angle so that a segment 26a of the lead bears firmly against the outer face of the end wall in a first direction, with a subsequent portion of the lead being bent into a hair-pin shaped portion 26b, prior to the terminating end section 26c thereof extending in substantially an opposite second direction across the end wall and beyond the peripheral edge thereof.

While a hair-pin shaped lead portion 26b has been found to normally not be required, the additional contact area of the lead with the outer surface of the associated flange may be necessary in certain situations when the lead is of a material, and size, that is not sufficiently stiff so that a simple right-angle bend will reliably maintain the movable end wall 21 firmly against the open end of the tubular member 19, in opposition to the biasing force of a given spring as assembled. Considered another way, with relatively weak or yieldable leads, the hair pin portions serve to minimize any possible tendency of the movable end wall to become slightly skewed during normal use, i.e., the peripheral edge of such end wall on the side opposite the direction in which the lead extends outwardly therefrom, becoming slightly displaced from the otherwise mating peripheral and terminating edge of the tubular member. It has been found in practice, however, that when the leads are made out of material such as OFHC copper, and are approximately 32 mils in diameter, which is equivalent to 20 gauge wire, that a simple right angle bend imparted to the leads, as depicted in the device 15 of FIGS. 1–4, is more than sufficient to hold the device together during normal use.

FIGS. 6–9 illustrate several other lead configurations applicable for used in protective devices of the general type depicted in FIGS. 1–4. In these figures, as well as certain others described hereinafter, structural elements in the various subsequently described devices that essentially correspond to those in device 15 of FIGS. 1–4 will be identified by like reference numberals.

Considering FIG. 6 now in greater detail, a protective device 30, in additionn to incorporating a tubular member 19, a movable end wall 21, a coil spring 23 and a fusible element (not seen) which may be a resistor 16 of the type embodied in device 15 depicted in FIG. 2, further includes a pair of uniquely configured leads 31,32, with a short auxiliary wire segment 33 suitable secured to each lead (see FIG. 7). Each wire segment is secured to a different lead immediately adjacent the outer surface of the associated one of the integral and movable end walls forming part of the device housing. These wire segments may be soldered, welded or brazed, for example, to the wire leads. With such attached wire segments 33, the leads 31, 32 may extend an appreciable distance in an axial direction outwardly from the respectively associated end walls before being oriented into parallel extending relationship. As such, alignment of the leads with a given pair of spaced receiving apparatus of a printed circuit board, for example, may be readily effected without any need for the leads to also serve as device securement elements. The attachment of the wire segments 33 to the leads 31, 32 is preferably affected while the otherwise completely assembled device 30 is temporarily nested in a suitable fixture.

With respect to the configuration of the leads 31, 32, and by way of further illustration, the first of the two intermediate offset bends formed in each lead is oriented such that the resulting stop-defining lead segments 31a, 32a thereof, formed between the two respectively associated offset bends, extend inwardly toward other rather than outwardly, as depicted in the embodiment of FIGS. 1–4. In all oter respects the protective device 30 is essentially identical structurally to the deivce and operates in the same manner.

The protective device 35 depicted in FIG. 8 distinguishes over the device 30 only in the manner in which the leads 36, 37 are bent to effect not only the requisite spacing therebetween, but the desired spacing of the composite housing 22 from the circuit board 24 (or any other substrate). Such a lead configuration also faciliatates the spring 23 bending the leads in opposite directions with respect to each other (as depicted in FIG. 4) in response to an overload-induced fracture (or separation) of the fusible element (not shown) confined within the composite housing 22. As mentioned in connection with device 30, the fusible element in the device 35 may comprise a fracturable resistor of the type described in connection with the device 15 of FIGS. 1–4. Alternatively, any other type of fusible element may be employed as long as it is capable of being separated into two sections by the force of the spring 23 in response to a maximum predetermined overload condition.

FIG. 9 depicts a further embodiment of the invention wherein a protective device 40 distinguishes from the above-described devices 30 and 35 by including a pair of wire elements 41, 42 which are attached, such as by soldering, welding or brazing, to respective leads 43, 44. The wire segments 41, 42 are dimensioned in length and oriented such that they function as stops, independently of the associated leads, to position the housig of the device at a particular desired elevation above the circuit board 24, or any other type of supporting substrate. With the wire elements 41, 42 also being secured to the leads 43, 44 immediately adjacent the outer surfaces of the integral and movable housing end walls, respectively, while the coil spring 23 is maintained under compression, it is seen that they also serve to normally hold the assembled device together in the same manner as do the wire segments 33 employed in the device 30 and 35 depicted in FIGS. 6 and 8 respectively. In all other respects, the device 40 is essentially identical to the previously described devices.

FIG. 10 illustrates another embodiment of the invention wherein a device 45 distinguishes over the device 15 (of FIGS. 1-4) primarily in having an integral flangetype boss 46 formed circumferentially about, and located along an intermediate region of, a tubular insulative member 47. As thus positioned, the boss-defining flange 46 allows a coil spring 48 of shorter axial length than the spring 23 of the device 15, to be employed. This may be desirous in certain situations where the axial length of the fusible element, for example, must be considerably longer than the length necessary for the spring in order for the fusible element to be open-circuit responsive to a particular overload condition.

The leads 49 of the device 45 depicted in FIG. 10 are shown only in fragmentary view, with it being understood that they could be readily formed with intermediate offset bends as depicted in FIG. 1. Alternatively, with secured wire segments, such as those designated by reference numeral 33 in FIGS. 6-8, or with the auxiliary wire elements 41, 42 depicted in FIG. 9, the leads 49 of the device 45 could take any number of configurations in addition to those specifically illustrated in FIGS. 5-9.

FIG. 11 illustrates a protective device 50 which is also similar to the device 15 of FIGS. 1-4, with the exception of the fusible element 51 incorporated therein. By way of example, the fusible element 51 is of the non-resistive type, and in its simplest form may comprise a flat metallic member made, for example, out of lead antimony alloys or tin-lead-cadmium-bismuth alloys, and preferably having a necked down (or otherwise cross-sectionally reduced) intermediate region 51a that is dimensioned so as to readily weaken or soften when subjected to a predetermined current (or voltage) induced overload condition.

It becomes readily apparent, of course, that when an overload condition is reached in the device 50, the coil spring 23 thereof, when exhibiting the proper degree of compressive force, will effect the separation of the fusible element 51 into two sections in the same manner as is realized with the fracturable resistive element 11 described hereinabove. In all other respects, the device 50 functions in the same manner as the device 15 with respect to establishing an open circuit condition. The leads 52 in device 50, shown only in fragmentary view, may take any one of a number of different configurations, including any of those emobodied in the previously described protective devices.

FIG. 12 illustrates a protective device 55 that is essentially identical to the device 50, as well as 15, with the exception that the fusible element comprises a soldered connection 56. This connection is formed between the terminating ends of two conductive wire elements 57 and 58, with the overlying interfaces thereof preferably being flattened and of predetermined dimensions. As illustrated, the wire elements also form the external leads of the device. If desired, however, the soldered wire elements 57, 58 may be distinct from the outwardly extending external leads of the device. In such an event, the external leads could be suitably secured to the internal wire segments, forming part of the fusible soldered connection, by any suitable means, but preferably by the used of welded or brazed connections.

It is understood, of course, that both the composition of solder employed, as well as the mass thereof, will have a direct bearing on any given maximum current (or voltage) induced overload condition required to effect an open-circuit in the device 55. In all other respects, the structural elements of the device 55 are essentially identical to those of devices 15 and 50, with it being understood that the configuration of the leads of device 55 may take any one of a number of different forms in practice.

FIG. 13 illustraes still another embodiment of the invention wherein a protective device 60 comprises a resistive element 61 that may be of the type depicted in device 15 of FIGS. 1-4, with axially disposed leads 62, 63, an insulative tubular member 64, formed with an integral and apertured end wall 64a, and with a circumferentially disposed and integral boss-defining flange 64b. The latter is located along an intermediate region of the tubular member 64 so that in cooperation with the flange portion of an insulative, movable end wall 66, a coil spring 67 of restricted axially length is normally maintained under compression therebetween.

In accordance with an aspect of the invention, the device 60 further includes a metallic end cap 68 that is secured by any suitable menas, such as by a force fit, or by crimping, onto the outer surface of, and along the integral end wall region of, the tubular member 64. The metallic end cap 68 is also formed with a central aperture so as to accommodate the lead 62 passing therethrough.

As thus constructed, the metallic end cap 68 of the device 60 allows the device to be readily received within a spring clip (not shown) to thereby not only provide a mount for the composite device, but provide the means for electricically connecting one end of the device to associated external circuitry. When used with a spring clip, the lead 62 is preferably abruptly bent at a right angle against the outer surface of the end cap 68 (as depicted by the solid line portion of the lead), and then soldered thereto as represented by the solder fillet 71 shown in phantom. When used in this manner, the lead 63 on the opposite end of the device would normally be formed with a sharp right angle bend and then dimensioned in length so as to extend outwardly from the device sufficiently to be readily accessible for effecting an electrical connection with associated external circuitry. Lead 63 could optionally also be configured so as to function selectively as an additional support element and spacer element, as described hereinabove in detail with respect to the leads of device 15.

Alternatively, both leads 62 and 63 may be sharply bent against the outer surfaces of the metallic end cap 68 and insulative movable end wall 66, respectively, so as not only to hold the device together, but provide both support for the device and means for effecting external circuit connections thereto. It is appreciated, of course, that auxiliary device securing wire segments or elements of the types depicted in FIGS. 6-9 could also be employed in the device 60, as could other fusible elements, such as of the types depicted in FIGS. 11 and 12.

With respect to the integral boss 64b in the device 60, as well as the boss 46 in the device 45 of FIG. 10, it sould also be understood that they may be located at any point along the axial length of the device housing, with the only requirement being that there be sufficient space to accommodate a spring that is capable of providing the requisite compressive force to effect a reliable open-circuit condition should the fusible element, in whatever form, require separation in response to a predetermined overload condition.

In summary, a number of protective devices have been disclosed that rely on a unique, spring-biased housing that cooperates with a leaded fusible element to effect a reliable open-circuit condition in response to a given current (or voltage) induced overload condition, with the leads of the fusible element providing not only the means for interconnecting the device with associated circuitry, but by being specially configured, providing a simplified, inexpensive and reliable way of normally holding the assembled device together, in opposition to a predetermined closed-circuit tensional biasing force applied thereagainst by the housing during normal operation. The specially configured leads have also been shown to provide the means for mounting the device directly on a circuit board, for example, and in spaced relationship therewith if desired.

While a number of different types of fusible elements and housings therefor have been disclosed herein, it it is obvious that various modifications may be made to the present illustrative embodiments of the invention, and that a number of alternatives may be provided, without departing from the spirit and scope of the invention. By way of example, instead of utilizing auxiliary wire segments, optionally attached to the leads, for device securement, the leads could also be crimpled to form cross-sectional areas immediately adjacent the outer surfaces of the respective housing end walls that would not allow their passage through the central apertures thereof.

What is claimed is:

1. A protective device comprising:
fusible means capable of at least establishing a weakened condition along an electrical circuit-path-defining dimension thereof when subjected to a specified current-induced over-load condition:
biasing means;
insulative enclosure means for said fusible means including a substantially tubular member having one fixedly secured and apertured end wall, and being adapted to provide an abutment for one end of said biasing means, and further including a movable apertured end wall adapted to normally substantially enclose the end of said tubular member opposite said secured end wall thereof, and to confine said biasing means between said movable end wall and said abutment of said tubular member; and
conductive terminating means respectively secured to the ends of the circuit-path-defining dimension of said fusible means, and being adapted to pass through the apertures of, and to be brought into firm engagement with, the outer surfaces of the respectively adjacent secured and movable end walls such that said movable end wall is normally positioned against te adjacent end of said tubular member, in opposition to a predetermined degree of compressive force imparted thereagainst by said biasing means, but with said latter force being sufficient, in response to said fusible means being subjected to a given overload condition, to physically separate sad fusible means into two sections along the resultant weakened region thereof by displacing said movable end wall, together with that portion of the associated terminating means in engagement therewith, and that section of the sub-divided fusible means associated therewith, a predetermined increased distance relative to said tubular member.

2. A protective device in accordance with claim 1 wherein said secured end wall comprises an integral part of said tubular member, wherein said abutment comprises an integral peripheral flange portion of said end wall, wherein said movable end wall is formed with a flange portion, and is of insulative material, and wherein said biasing means comprises a coil spring coaxially positioned on said tubular member and confined between said integral and movable flange portions.

3. A protective device in accordance with claim 2 wherein said fusible means comprises a resistor of the type capable of fracturing and, thereby, of establishing a physical separation along its axis length when subjected to a predetermined current-induced overload condition, and wherein said condition terminating means comprises a pair of conductive leads axially secured respectively to opposite ends of said resistor.

4. A protective device in accordance with claim 3 wherein outer terminating end regions of said resistor leads are bent into parallel extending relationship in a direction substantially perpendicular to the axis of said tubular member so as to facilitate the mounting of said device on a circuit board.

5. A protective device in accordance with claim 4 wherein intermediate portions of said leads that extend beyond the respectively associated end walls are formed with offset bends to provide respective stops for spacing said device above a circuit board.

6. A protective device in accordance with claim 1 wherein said integral abutment comprises an integral flangelike portion of said tubular member located along an intermediate region thereof, and being circumferentially disposed.

7. A protective device in accordance with claim 6 further including a metallic end cap coaxially mounted on an end region of said tubular member between said flange-like abutment and said fixedly secured end wall, said end cap being adapted to be received within a spring clip, and having an aperture therethrough that is aligned with the aperture in said fixedly secured end wall, with the adjacent one of said conductive terminating means extending through both of said aligned apertures and conductively engaging the outer surface of said end cap for both device securement and electrical continuity.

8. A protective device in accordance with claim 7 wherein said fusible means comprises an elongated resistor of the type capable of fracturing and, thereby, of establishing a physical separation along its axial length when subjected to a specified overload condition, and wherein said conductive terminating means comprises oppositely directed and axially secured resistor leads, and wherein said end wall apertures allow passage of the respectively adjacent leads therethrough, with said leads being configured along upper end regions thereof immediatly adjacent the respectively associated outer end wall surfaces such that the configured regions constitute securement means that cooperated to normally hold said composite protective device together, with said spring means normally being maintained under the desired degree of compression between said flange-like abutment and said moveable end wall.

9. A resistive protection device comprising:
resistor means capable of fracturing and, thereby, of establishing a physical open-circuit separation therealong when subjected to a specified current-induced overload condition;

an insulative tubular member for receiving said resistor means therewithin, and having one integral end wall formed with a lead-receiving aperture therethrough, and with a flange portion;

a movable insulative end wall adapted to substantially enclose the other end of said tubular member, and having a lead-receiving aperture formed therethrough and a flange portion;

elongated coil spring means coaxially positioned on said tubular member and normally confined between said integral and movable end wall flange portions, and normally maintained under a predetermined degree of compression, and a pair of conductive lead respectively and electrically connected to opposite ends of said resistor means, each iof said leads extending outwardly through the aperture formed in the adjacent one of said end walls, with an upper end region of both leads immediately adjacent the outer surfaces of the respectively associated end walls being configured such that they function as stops to normally prevent may relative displacement between the assembled end walls normally maintained under mutually opposed spring bias, said leadforming stops, thereby, holding said composite device together until such time that a predetermined overload condition would induce a fracture in saidresistor means which would, in turn, result in said spring urging said resistor means into two sections at the point of fracture and, in turn, displacing said end walls and associated lead ends in engagement therewith apart a predetermined distance to establish an open circuit gap in the region of said fracture.

10. A resistive protective device in accordance with claim 9 wherein said upper end configured region of each lead comprises a sharp right angle bend that positions a segment of each lead firmly against the mating outer surface of said associated end wall, and wherein the corresponding terminating end portions of said leads are oriented so as to be not only in substantially parallel relationship, but substantially perpendicular to said tubular member so as to allow the insertion of said terminating lead portions into aligned apertures of an associated circuit board.

11. A resistive protective device in accordance with claim 10 wherein a section of each lead intermediate the configured region and the terminating end portion is formed therebetween that is adapted to normally rest on the upper surface of a circuit board and, thereby, provide a predetermined spacing between said circuit board and the tubular member of said protective device.

12. A resistive protective device in accordance with claim 11 wherein said resistor is of the carbon type, and wherein said tubular member and movable end wall are made of an insulative plastic material exhibiting excellent arc quenching and first resistant properties.

13. A protective device comprising:

fusible means capable of at least establishing a weakened physical condition along an electrical circuit-pathdefining dimension thereof when subjected to a specified current-induced overload condition;

insulative enclosure means for said fusible means including a substantially tubular member having one secured end wall formed with an integral flange portion, and further including an insulative movable end wall formed with a flange portion, and being adapted to normally enclose the end of said tubular member opposite said secured end wall thereof, each of said walls having a central aperture formed therein;

conductive terminating means respectively secured to the ends of the circuit path-defining dimension of said fusible means and extending through the respectively associated apertures of said end walls, said terminating means being formed to maintain said flange portions normally in a desired spaced relationship, and to allow external connections to be made to said fusible means, and spring means mounted on said tubular member and normally maintained under a predetermined degree of compression between said flange portions of said enclosure means, said compressive force being sufficient, in response to said fusible means being subjected to a predetermined overload condition, to physically separate said fusible means into two sections along the resultant weakened region thereof and, thereby, effect an open-circuit gap along the electrical circuit path dimensions thereof, by displaying said flange-formed end walls, together with at least the upper end regions of the conductive terminating means in respective engagement therewith, a predetermined increased distance relative to each other and from their normally spaced relationship, as assembled.

14. A protective device in accordance with claim 13 whereinsaid fusible means comprises an elongated metallic member having an intermediate region of reduced cross-section that is capable of being weakened to such an extent in response to a predetermined overload condition, that the tensional force normally imparted thereagainst by said spring means will effect a separation of said elongated member into two sections.

15. A protective device in accordance with claim 13 whereinsaid conductive terminating means comprises a pair of oppositely directed wire-like elements, and wherein this fusible means comprises a normally secured connection between overlapping free ends of said wire-like elements, with the interfaces thereof being of predetermined dimensions and secured together by a metallic material capable of at least softening to such an extent in response to an overload condition, that the tensional force normally imparted thereagainst by said spring means will effect a separation of the free ends of said wire-like elements.

16. A protective device in accordance with claim 13 wherein each of said conductive means includes a wire lead, with a wire segment secured thereto immediately adjacent the outer surface of the associated end wall, and extending at least a short distance therealong.

* * * * *

UNITED STATES PATENT OFFICE   Page 1 of 2
CERTIFICATE OF CORRECTION

Patent No. 4,047,143                     Dated  September 6, 1977

Inventor(s)  DAVID M. BURDEN and FRANK N. MALANEY Case 1-1

It is certified that error appears in the above-identified patent and that said Letters Patent are hereby corrected as shown below:

In the specification, Column 1, line 20, "fust" should be --fuse--. Column 2, line 10, "used" should be --use--; line 11, "elemnts" should be --elements--. Column 4, line 44, "devcie" should be --device--; line 53, "illstration" should be --illustration--; line 65, "oposite" should be --opposite--. Column 5, line 7, "compession" should be --compression--; line 25 "as" should be --an--;
line 45, "of" should be --or--. Column 6, line 10, "allos" should be --allow--; line 19, "suitable" should be --suitably--; line 50, "vlatage" should be --voltage--. Column 7, line 66, "used" should be --use--. Column 8, line 5, "additionn" should be --addition--; line 10, "suitable" should be --suitably--; line 22, "apparatus" should be --apertures--; line34, after "toward", insert --each--; line 36, "oter" should be --other--; line 37, "deivce" should be --device--;
line 64, "housig" should be --housing--. Column 9, line 8, "device" should be --devices--; line 55, "emobodied" shoudl be --embodied--. Column 10, line 14, "illustraes" should be --illustrates--; line 28, "menas" should be --means--; line 66, "sould" should be --should--. Column 11, line 30, "crimpled" should be --crimped--.

In the claims, claim 1, column 11, line 59, "te" should be --the--; line 65, "sad" should be --said--. Claim 3, Column 13, line 16, "axis" should be --axial--. Claim 8, column 12, line 6, "cooperated" should be --cooperate--. Claim 9, column 13, line 16, "lead" should be --leads--; line 23, "may" should be --any-- Claim 11, column 13, line 50, after "formed" should read --with at least two offset bends so as to provide a stop region--.

UNITED STATES PATENT OFFICE
CERTIFICATE OF CORRECTION

Patent No. 4,047,143          Dated September 6, 1977

Inventor(s) DAVID M. BURDEN and FRANK N. MALANEY Case 1-1

It is certified that error appears in the above-identified patent and that said Letters Patent are hereby corrected as shown below:

Claim 12, column 13, line 58, "first" should be --fire--. Claim 13, column 14, lines 29 and 30, "displaying" should be --displacing--. Claim 15, column 14, line 45, "whereinsaid" should be --wherein said--; line 47, "this" should be --said--.

Signed and Sealed this

Thirtieth Day of September 1980

[SEAL]

Attest:

SIDNEY A. DIAMOND

Attesting Officer          Commissioner of Patents and Trademarks